United States Patent
Hebert et al.

(10) Patent No.: US 9,245,997 B2
(45) Date of Patent: Jan. 26, 2016

(54) METHOD OF FABRICATING A LDMOS DEVICE HAVING A FIRST WELL DEPTH LESS THAN A SECOND WELL DEPTH

(71) Applicant: MagnaChip Semiconductor, Ltd., Cheongju-si (KR)

(72) Inventors: Francois Hebert, San Mateo, CA (US); I-Shan Sun, San Jose, CA (US); Young Bae Kim, Cheongju-si (KR); Young Ju Kim, Cheongju-si (KR); Kwang Il Kim, Cheongju-si (KR); In Taek Oh, Cheongju-si (KR); Jin Woo Moon, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/453,246

(22) Filed: Aug. 6, 2014

(65) Prior Publication Data

US 2015/0041894 A1 Feb. 12, 2015

Related U.S. Application Data

(60) Provisional application No. 61/863,978, filed on Aug. 9, 2013.

(30) Foreign Application Priority Data

Aug. 9, 2013 (KR) .................. 10-2013-0095040
Feb. 25, 2014 (KR) .................. 10-2014-0022069

(51) Int. Cl.
*H01L 29/78* (2006.01)
*H01L 29/06* (2006.01)
*H01L 21/266* (2006.01)
*H01L 29/66* (2006.01)
*H01L 29/10* (2006.01)
*H01L 29/08* (2006.01)

(52) U.S. Cl.
CPC .......... *H01L 29/7816* (2013.01); *H01L 21/266* (2013.01); *H01L 29/0634* (2013.01); *H01L 29/0882* (2013.01); *H01L 29/1095* (2013.01); *H01L 29/66659* (2013.01); *H01L 29/66681* (2013.01); *H01L 29/7835* (2013.01)

(58) Field of Classification Search
CPC ................................................ H01L 29/7816
USPC ........................................................ 257/339
See application file for complete search history.

(56) References Cited

U.S. PATENT DOCUMENTS

| | | | |
|---|---|---|---|
| 5,313,082 A | 5/1994 | Eklund | |
| 5,374,843 A | 12/1994 | Williams et al. | |
| 6,570,219 B1 * | 5/2003 | Rumennik et al. | ............. 257/343 |
| 6,903,421 B1 * | 6/2005 | Huang | ................ H01L 29/0634 |
| | | | 257/335 |
| 7,173,308 B2 * | 2/2007 | Kitaguchi | ..................... 257/342 |
| 7,265,416 B2 | 9/2007 | Choi et al. | |

(Continued)

OTHER PUBLICATIONS

U.S. Appl. No. 14/218,021, filed Mar. 18, 2014, Francois Hebert et al., MangaChip Semiconductor, Ltd.

(Continued)

*Primary Examiner* — Marc Armand
*Assistant Examiner* — Younes Boulghassoul

(57) ABSTRACT

A method of fabricating a semiconductor device capable of increasing a breakdown voltage without an additional epitaxial layer or buried layer with respect to a high-voltage horizontal MOSFET.

16 Claims, 9 Drawing Sheets

(56) References Cited

U.S. PATENT DOCUMENTS

| | | |
|---|---|---|
| 7,436,024 B2 | 10/2008 | Kumagai et al. |
| 8,212,318 B2 * | 7/2012 | Knaipp ............... H01L 29/0886 257/341 |
| 2006/0027863 A1 * | 2/2006 | Kumagai et al. ............. 257/335 |
| 2010/0148254 A1 * | 6/2010 | Park ............................ 257/337 |
| 2011/0101454 A1 * | 5/2011 | Ichijo et al. ................. 257/339 |
| 2011/0233673 A1 * | 9/2011 | Liu et al. ...................... 257/343 |
| 2012/0112277 A1 * | 5/2012 | Denison et al. ............... 257/337 |
| 2013/0341718 A1 * | 12/2013 | Kim et al. .................... 257/342 |
| 2014/0061788 A1 * | 3/2014 | Chen .................. H01L 29/7816 257/339 |
| 2014/0070311 A1 * | 3/2014 | Yang et al. .................... 257/335 |

OTHER PUBLICATIONS

U.S. Office Action issued on Apr. 23, 2015 in related U.S. Appl. No. 14/218,021 (15 pages, in English).

* cited by examiner

FIG. 7

| Split | BVDSS |
|---|---|
| Split-1 | 79.423 |
| Split-2 | 439.34 |
| Split-3 | 795.73 |
| Split-4 | 794.74 |
| Split-5 | 764.74 |
| Split-6 | 786.96 |

# METHOD OF FABRICATING A LDMOS DEVICE HAVING A FIRST WELL DEPTH LESS THAN A SECOND WELL DEPTH

CROSS-REFERENCE TO RELATED APPLICATIONS

This application is a Non-Provisional Application of U.S. Provisional Application No. 61/863,978, filed Aug. 9, 2013, which claims priority under 35 USC 119(a) to Korean Patent Application Nos. 10-2013-0095040 filed on Aug. 9, 2013 and 10-2014-0022069 filed on Feb. 25, 2014, the entire disclosures of which are incorporated herein by reference for all purposes.

BACKGROUND

1. Field

This application relates to a method of fabricating a semiconductor device capable of increasing a breakdown voltage without an additional epitaxial layer or buried layer with respect to a high-voltage horizontal MOSFET.

2. Description of Related Art

In a conventional N-type LDMOS (Lateral Double diffused MOS), a body region that includes a source region is connected to a ground, and a breakdown voltage from a high concentration N-type (N+) source region to the body region is highly limited. Particularly, the breakdown voltage is typically much lower than about 20 V.

Various methods have been suggested to increase the low breakdown voltage of an LDMOS device. By way of example, there is a method of forming a deep well extending from a drain region to a P-type body region surrounding a source region so that the deep well surrounds the P-type body region, or a method of forming a low concentration N-type extension region surrounding a high concentration N-type source region. Although it has been possible to increase a breakdown voltage by a certain amount using these methods, it has not been possible to obtain a breakdown voltage of 100 V or more.

Further, in a method of forming a high concentration N+ buried layer between the substrate and a deep well region while forming a thick epitaxial layer on a substrate, a method of fully isolating the P-type body region and the substrate was also suggested. Nevertheless, there were problems in that not only does a technical configuration to form a buried layer and a thick epitaxial layer require a high unit price, but also many applications exist that do not require this fully isolating technique.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of fabricating a semiconductor device includes forming a deep well in a substrate, the deep well including at least two regions having different depths; forming a body region inside the deep well; forming a drain region inside the deep well; and forming a source region inside the body region; wherein a depth of the deep well under the body region is different from a depth of the deep well under the drain region; and a conductivity type of the body region is different from a conductivity type of the deep well.

The depth of the deep well under the body region may be less than the depth of the deep well under the drain region.

The method may further include forming a drain extension region inside the deep well; and the forming of the drain region inside the deep well may include forming the drain region inside the drain extension region.

A dopant concentration of the deep well under the body region may be smaller than a dopant concentration of the deep well under the drain region.

The forming of the deep well may include forming the deep well using a deep well mask pattern formed on the substrate, the deep well pattern including a stripe.

The forming of the deep well may include forming the deep well mask pattern including the stripe on the substrate; and implanting ions into the substrate through the deep well mask pattern to form the deep well.

The mask pattern may include a plurality of stripes.

A stripe interval between the stripes may be greater than 0 and less than or equal to 3 µm.

A bottom surface of the deep well under the body region may include a plurality of grooves or the bottom surface of the deep well of the deep well under the body region may have a shape of a wave pattern.

A breakdown voltage between the drain region and the source region (BVDSS) may be at least 700 V.

The method may further include forming a buried layer near the drain region.

The method may further include forming a buried layer near the source region.

In another general aspect, a semiconductor device includes a substrate; a first deep well in the substrate; a second deep well in the substrate; a drain region in the first deep well; a body region in the second deep well; and a source region in the body region; wherein a depth of the second deep well is less than a depth of the first deep well.

The substrate and the body region may be of a first conductivity type; and the first deep well, the second deep well, the drain region, and the source region may be of a second conductivity type different from the first conductivity type.

A dopant concentration of the second deep well may be smaller than a dopant concentration of the first deep well.

The first deep well and the second deep well may be joined together.

A bottom surface of a boundary region where the first deep well and the second deep well are joined together may include a groove.

A bottom surface of the second deep well may include a single groove.

A bottom surface of the second deep well may include a plurality of grooves.

The semiconductor device may further include a drain extension region in the first deep well surrounding the drain region.

The semiconductor device may further include a body contact region in the body region.

The semiconductor device may further include a buried layer in the first deep well.

The semiconductor device may further include a buried layer overlapping the second deep well and the body region at a bottom surface of the body region.

The buried layer may extend into the first deep well.

The semiconductor device may further include a gate oxide layer overlying a portion of the first deep well, a portion of the second deep well, a portion of the body region, and a portion of the source region.

A breakdown voltage between the drain region and the source region (BVDSS) may be at least 700 V.

Other features and aspects will be apparent from the following detailed description, the drawings, and the claims.

BRIEF DESCRIPTION OF THE DRAWINGS

FIG. 7 illustrates an example of a table of maximum drain-source breakdown voltages (BVDSS) for various fabricating methods in FIG. 5.

DETAILED DESCRIPTION

Figure 1A:
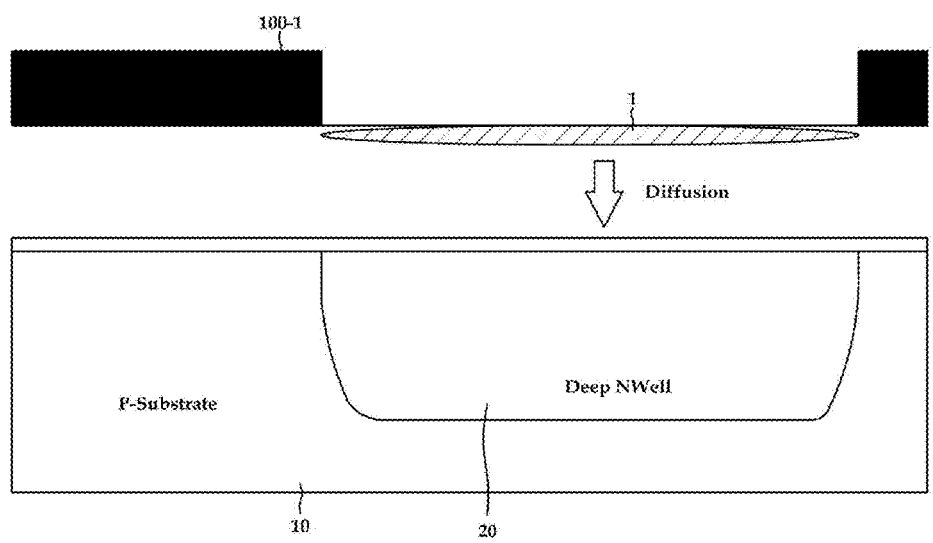
FIGS. 1A to 1D illustrate an example of a method of fabricating a semiconductor device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

It will be understood that, although the terms first, second, A, B, etc., may be used herein in reference to various elements, these elements should not be construed as being limited by these terms. For example, a first element could be termed a second element, and a second element could be termed a first element, without departing from the scope of the description. The term "and/or" includes any and all combinations of one or more listed items.

The terminology used herein is for the purpose of describing particular examples only, and is not intended to limit the description to these particular examples. As used herein, the singular forms "a," "an," and "the" are intended to include the plural forms as well, unless the context clearly indicates otherwise. It will be further understood that the terms "comprises" and/or "comprising," when used in this description, specify the presence of stated features, integers, steps, operations, elements, and/or components, but do not preclude the presence or addition of one or more other features, integers, steps, operations, elements, components, and/or groups thereof.

Hereinafter, examples will be described with reference to the accompanying drawings.

FIGS. 1A to 1D illustrate an example of a method of fabricating a semiconductor device.

As shown in FIG. 1A, a first deep well of an N-type 20 is formed by ion-implanting an N-type dopant 1 using a deep well mask pattern 100-1 on a P-type substrate 10. Through this mask process, the N-type dopant 1 is ion-implanted in one region of the P-type substrate 10. The N-type dopant 1 may be phosphorus (P), arsenic (As), Antimony (Sb), or any other N-type dopant known to one of ordinary skill in the art.

Thereafter, through a diffusion process of the ion-implanted N-type dopant 1, a first deep well of an N-type 20 is formed as shown in FIG. 1A. Additionally, an oxidation process may be performed on a surface of the P-type substrate 10.

Figure 1B:
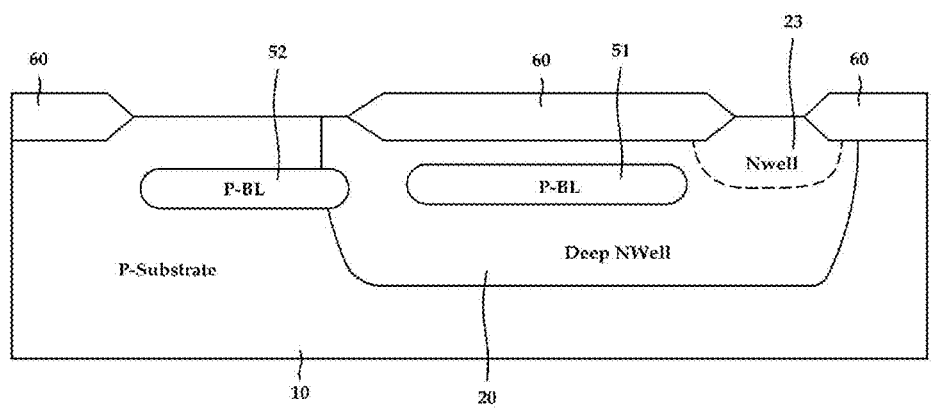
Figure 1C:
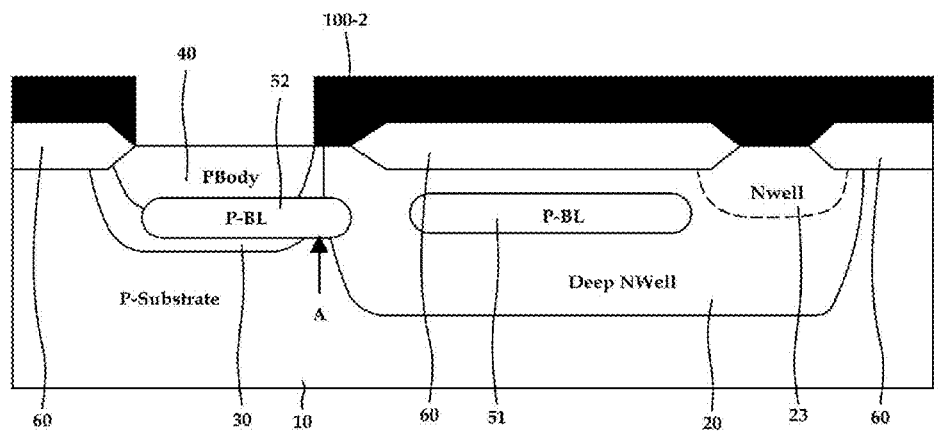

Subsequently, as shown in FIG. 1B, an oxide layer 60 is formed through the oxidation process and an etching process on the surface of the semiconductor device in FIG. 1A. A LOCOS (LOCal Oxidation of Silicon) layer 60 in accordance with a LOCOS process may be formed as the oxide layer, or an STI (Shallow Trench Isolation) layer 60 formed by means of a trench may be formed as the oxide layer. However, other methods of forming an oxide layer known to one of ordinary skill in the art may be used to form the oxide layer 60.

Also, an N-type drain extension region 23 is formed inside the first deep well of N-type 20. The drain extension region 23 is formed to surround a drain region 25 (see FIG. 1D) formed later that is doped in a high concentration, and serves to mitigate an electric field of the high concentration doped drain region 25. To this end, a concentration of the drain extension region 23 is designed to be lower than a concentration of the drain region 25.

A dopant concentration of the N-type drain extension region 23 may be different from a dopant concentration of the first deep well of N-type 20. By way of example, a dopant concentration of the N-type drain extension region 23 may be higher than that of the first deep well of N-type 20. By setting a dopant concentration of the N-type drain extension region 23 to be higher than that of the first deep well of N-type 20, a breakdown voltage of a semiconductor device can be increased.

Furthermore, a P-type buried layer 51 is formed near the drain extension region 23 or the drain region 25 in the first deep well of N-type 20. Hereinafter, for brevity and simplicity, the P-type buried layer 51 will be referred to as a first buried layer of a P-type 51. That is, as shown in FIG. 1B, regarding one region inside the first deep well of N-type 20, a P-type dopant such as boron (B), indium (In), aluminum (Al), gallium (Ga), or any other P-type dopant known to one of ordinary skill in the art is ion-implanted, thereby forming the first buried layer of P-type 51. In FIG. 1B, there is disclosed a structure in which only one first buried layer of P-type 51 is formed. However, the first buried layer of P-type 51 may be formed as a plurality of buried layers of P-type isolated from each other by a certain interval up or down according to the characteristics of the semiconductor device.

By forming a first buried layer of a P-type 51 inside the semiconductor device, when a double RESURF (Reduced Surface Field) structure is formed, multiple current channels are then formed at upper/lower portions of the first buried layer of P-type 51. Accordingly, an on resistance of a semiconductor device is decreased.

In FIG. 1B, although an example is shown in which the first buried layer of P-type 51 is separated from a surface of the substrate by a certain interval, according to the characteristics of the semiconductor device, the first buried layer of P-type 51 may be formed to contact a LOCOS layer 60 or to be close thereto.

Also, near a source region 45 (see FIG. 1D) that is formed later, a second buried layer of a P-type 52 is formed, although this is optional. The second buried layer of P-type 52 extends to the first deep well of N-type 20. The second buried layer of P-type 52 overlaps the second deep well of N-type 30 and a P-type body region 40 (see FIG. 10) explained later. By forming the second buried layer of P-type 52 mostly at the bottom surface of the P-type body region 40, a reduction of concentration of the P-type body region 40 is prevented. This has the effect of preventing an activity of a PNP parasitic device.

Subsequently, as shown in FIG. 10, by using a body mask pattern 100-2, a second deep well of N-type 30 (or an N-type body region 30) and a P-type body region 40 are formed. The second deep well of N-type 30 is the same region as the N-type body region 30, and these terms may be used interchangeably. With respect to the body mask pattern 100-2, one or two mask patterns may be used.

Specifically, the same mask pattern may be applied in regards to a body mask pattern 100-2 to form an N-type body region 30 or a second deep well of N-type 30 and a P-type body region 40. The mask pattern 100-2 may have an opening having a width based on a width of the P-type body region 40 to be formed. Through an ion implantation using the mask pattern 100-2, a P-type body region 40 having a certain depth and width is formed. Further, by applying an ion implantation of higher energy than when forming the P-type body region 40 and applying an appropriate rotate/tilt method, it is possible to form an N-type body region 30 that is deeper than the P-type body region 40 and has a width wider than the P-type body region 40. That is to say, while ion-implanting at a high energy, in a manner to ion-implant an N-type dopant using a tilted ion implantation method, an N-type body region 30 may thus be formed to fully surround the P-type body region 40.

It is possible that an order of forming an N-type body region 30 and a P-type body region 40 using the same mask pattern may be reversed. That is, it is possible to form the N-type body region 30 first, and then form the P-type body region 40.

Alternatively, different mask patterns may be used in place of the body mask pattern 100-2 to form a second deep well of an N-type 30 and a P-type body region 40.

By way of example, using a mask pattern for a second deep well of an N-type 30, a second deep well of an N-type 30 may be formed, and then using an additional mask pattern for a P-type body region 40, a P-type body region 40 may be formed.

Through the fabricating process as set forth above, the N-type body region (or second deep well of N-type 30) is formed in the P-type substrate 10 so that it contacts a portion of one side of the first deep well of N-type 20, and has a depth different from the depth of the first deep well of N-type 20. Preferably, the second deep well of N-type (or N-type body region 30) has a depth that is less than a depth of the first deep well of N-type 20. Namely, the first deep well of N-type 20 and the second deep well of N-type 30 are electrically connected with each other and physically joined with each other. Therefore, the first deep well of N-type 20 and the second deep well of N-type 30 may be considered to be one deep well. In other words, a deep well having different depths is formed inside one deep well region, and the deep well region is considered to be divided into a first deep well of N-type 20 and a second deep well of N-type 30. The second deep well of N-type 30 exists under the P-type body region 40, and the first deep well of N-type 20 exists under the drain region 25 (see FIG. 1D) to be formed later.

As shown in FIG. 10, a bottom surface of the second deep well of N-type 30 is not coplanar with a bottom surface of the first deep well of N-type 20.

Also, although FIG. 10 shows that the second deep well of N-type 30 has a uniform depth, this is just an example, and the second deep well of N-type 30 may have a non-uniform depth like in FIGS. 3A, 3B, 4A, and 4B. In other words, the bottom surface of the second deep well of N-type 30 need not be a straight line.

In one example, in the contact region of the second deep well of N-type 30 and the first deep well of N-type 20, a boundary groove (or dip, A) may be formed. Specifically, by the manner in which a portion of one side of the second deep well of N-type 30 is formed so that it contacts the first deep well of N-type 20, the boundary groove (or dip, A) may be formed in an interfacial region of the second deep well of N-type 30 and the first deep well of N-type 20.

In one example, dopant concentrations of the first deep well of N-type 20 and the second deep well of N-type 30 may be different from each other. By way of example, a dopant concentration of the second deep well of N-type 30 may be lower than that of the first deep well of N-type 20. This makes it possible to form a high impedance path.

Alternatively, in another example, a dopant concentration of the second deep well of N-type 30 may be higher than that of the first deep well of N-type 20. This makes it possible to form a low impedance path.

In the present example the second deep well of N-type 30 has a concentration lower than that of the first deep well of N-type 20. This is more advantageous in view of a breakdown voltage (BV). Compared to a case in which a second deep well of N-type 30 and a first deep well of N-type 20 have the same concentration, a resistance increases as one side's concentration decreases. Thus, when an electric field due to a high drain voltage is extended to the source region, due to the second deep well of N-type region 30 having a high resistance, the electric field is in turn alleviated, thereby making it possible to increase a drain-source breakdown voltage.

The second deep well of N-type 30 plays a role of an N-channel JFET that prevents a pinch-off phenomenon. In a lower end region of an accumulation region between the P-type body region 40 and a drift region (a region positioned under the LOCOS layer 60), an N-channel JFET structure is formed. When applying a high body potential to the P-type body region 40, it is possible that a depletion region may be drastically extended toward a P-type body region 40 and a P-type substrate 10 until it encounters the P-type substrate 10. Such a phenomenon is called "pinch-off". In this case, a body potential cannot be higher than a substrate potential, which is contrary to the intent of this application. It is thus necessary to secure a sufficiently wide N-channel JFET. To that end, it is necessary to make a width of a second deep well of N-type 30 wide enough to prevent the pinch-off phenomenon from occurring.

Figure 1D:
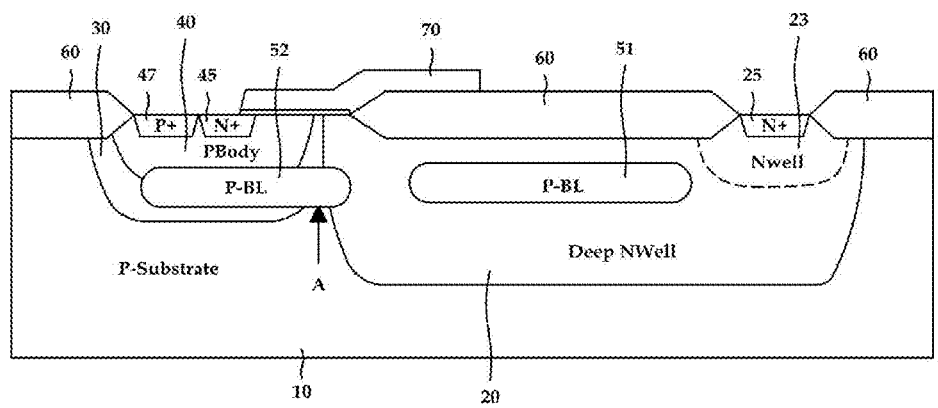

Subsequently, as shown in FIG. 1D, a high concentration N-type (N+) drain region 25 is formed inside the first deep well of N-type 20, and a high concentration N-type (N+) source region 45 and a high concentration P-type (P+) body contact region 47 are formed inside the P-type body region 40. Further, a gate electrode 70 is formed as a gate oxide layer overlapping the P-type body region 40, the first deep well of N-type 20, and the second deep well of N-type 30. A portion of the gate electrode 70 is formed on a thick LOCOS oxide layer 60 or an STI oxide layer 60. The P-type body region that is overlapped by the gate electrode 70 forms a channel region, and the first deep well of N-type 20 and the second deep well of N-type 30 that are overlapped by the gate electrode 70 form an accumulation region.

By forming a salicide region (not shown) on a gate electrode and an exposed silicon substrate, the semiconductor device may be operated as an N-type LDMOS. One of ordinary skill in the art will appreciate that the necessary process and device structure for this can be realized in an altered formation without departing from the spirit or scope of the example in FIGS. 1A to 1D.

A semiconductor device according to the aforementioned fabricating process is designed so that a second deep well of an N-type 30 is formed between a P-type substrate 10 and a P-type body region 40, thus enabling an electric potential of the P-type body region 40 to be different from an electric potential of the P-type substrate 10. This makes it possible to maintain the N+ source region 45 and the P+ body contact region 47 at the same electric potential, and eliminate a body effect. That is, it is possible for an electric field of the P-type body region 40 to be higher than an electric field of the P-type substrate 10.

FIGS. 2A to 2D illustrate another example of a method of fabricating a semiconductor device.

Figure 2A:
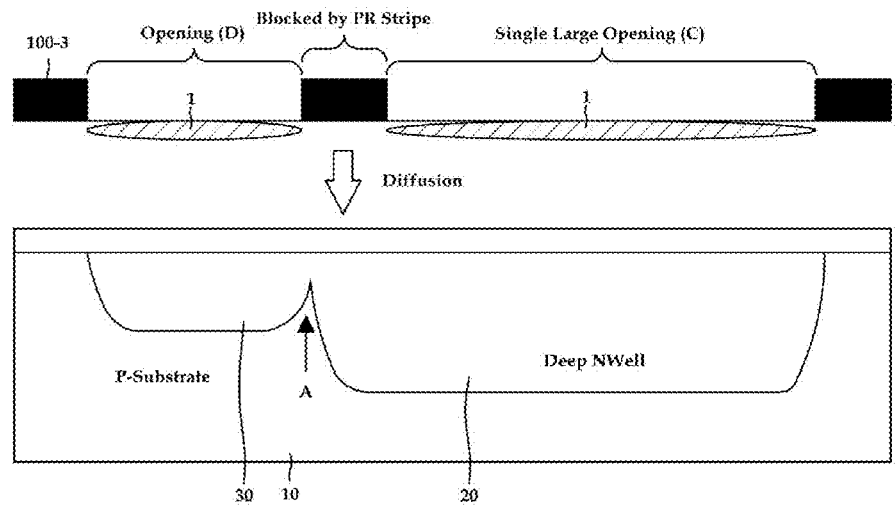
FIGS. 2A to 2D illustrate another example of a method of fabricating a semiconductor device.

As shown in FIG. 2A, a first deep well of an N-type 20 and a second deep well of N-type 30 (or an N-type body region 30) are formed integrally. The second deep well of N-type 30 is the same region as the N-type body region 30, and these terms may be used interchangeably. FIG. 2A shows a deep well mask pattern 100-3 for formation of this structure.

Although FIG. 2A shows that a deep well region including two regions having different depths is formed integrally, this is just an example, and in other examples, the deep well may include three or more regions having different depths.

Particularly, in the deep well mask pattern 100-3, there are formed an opening (C) for formation of a first deep well of N-type 20 and an opening (D) for formation of a second deep well of N-type 30 having widths different from each other. Because the first deep well of N-type 20 is formed to be deeper than the second deep well of N-type 30, the first deep well of N-type 20 may be called a deeper deep well, and the second deep well of N-type 30 may be called a shallower deep well. By using the deep well mask pattern 100-3 to simultaneously ion-implant an N-type dopant 1 such as phosphorus (P), arsenic (As), Antimony (Sb) or any other N-type dopant known to one of ordinary skill in the art through the two openings (C) and (D), it is possible to simultaneously form the first deep well of N-type 20 and the second deep well of N-type 30. Thereafter, through a diffusion process of the ion-implanted N-type dopant 1, the first deep well of N-type 20 and second deep well of N-type 30 are formed integrally as shown in FIG. 2A.

An ion implantation is limited due to the mask pattern (Blocked by PR Stripe) that exists at a boundary of the first deep well of N-type 20 and the second deep well of N-type 30. This forms a boundary groove (or dip, A) in the boundary region of the first deep well of N-type 20 and the second deep well of N-type 30. Since the first deep well of N-type 20 and the second deep well of N-type 30 of N-type are joined together due to a thermal diffusion process after the ion-implantation, a region around the boundary groove (or dip, A) may have a dopant concentration relatively lower than the first deep well of N-type 20 and the second deep well of N-type 30.

To obtain a more compact device area, the opening (C) for formation of the first deep well of N-type 20 is wider than the opening (D) for formation of the second deep well of N-type 30. This causes the depth of the first deep well of N-type 20 to be different from the depth of the second deep well of N-type 30. Even though the first deep well of N-type 20 and the second deep well of N-type 30 are ion-implanted at the same ion energy, an impact of the ions is affected by a width of an opening used to implant each of the first deep well of N-type 20 and the second deep well of N-type 30. A depth of an ion-implanted region implanted through an opening having a relatively small width (the second deep well of N-type 30) is less than a depth of an ion-implanted region implanted through an opening having a relatively large width (the first deep well of N-type 20). That is, a depth from a substrate surface of the second deep well of an N-type 30 that is positioned under a P-type body region 40 (see FIG. 2C) is less than a depth of the first deep well of an N-type 20. Also, a concentration of an ion-implanted region implanted through an opening having a relatively small width (the second deep well of N-type 30) is lower than a concentration of an ion-implanted region implanted through an opening having a relatively large width (the first deep well of N-type 20). This is because although the first deep well of N-type 20 and the second deep well of N-type 30 were ion-implanted at the same dose, the second deep well of N-type 30 was formed by ion-implantation through the opening having the relatively small width, so the dose of ion-implantation was distributed to be relatively smaller than the dose of ion-implantation that was ion-implanted through the opening having the relatively large width to form the first deep well of N-type 20. Since the dose is distributed to be small, the distributed amount is also small, thereby making it possible to form a lower concentration in the second deep well of N-type 30.

The first deep well of N-type 20 and the second deep well of N-type 30 are electrically connected with each other and are joined with each other physically. The first deep well of N-type 20 and the second deep well of N-type 30 may thus be considered to be one deep well. That is, a deep well having different depths is formed, and is considered to be divided into the first deep well of N-type 20 and the second deep well of N-type 30. The second deep well of N-type 30 exists under the P-type body region 40. The first deep well of N-type 20 exists under a drain region 25 (see FIG. 2D) formed later. Similar to the foregoing example in FIGS. 1A to 1D, in a contact region of the second deep well of N-type 30 and the first deep well of N-type 20, a boundary groove (or dip, A) is formed. Due to the manner in which a portion of one side of the second deep well of N-type 30 is formed to contact the first deep well of N-type 20, the boundary groove (or dip, A) is formed in an interfacial region of the second deep well of N-type 30 and the first deep well of N-type 20.

Similar to the example in FIG. 1A, a dopant concentration of the first deep well of N-type 20 and a dopant concentration of the second deep well of N-type 30 may be different from each other. By way of example, a dopant concentration of the second deep well of N-type 30 may be lower than that of the first deep well of N-type 20. This makes it possible to form a high impedance path. The impedance herein refers to a resistance.

Figure 2B:
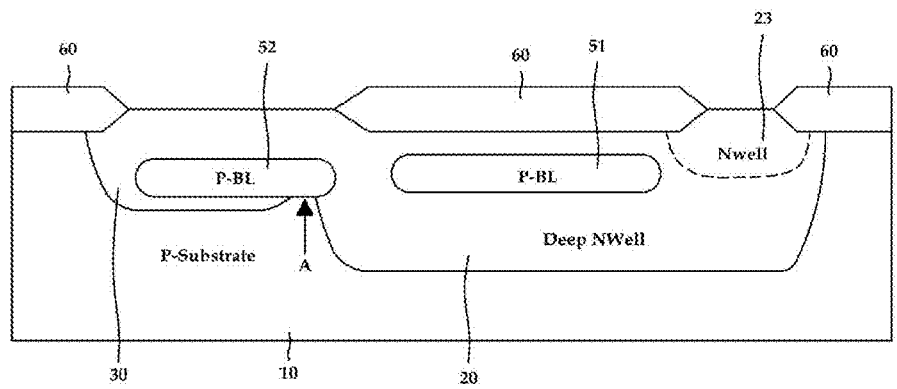

As shown in FIG. 2B, similar to the example in FIG. 1B, an N-type drain extension region 23 is formed inside the first deep well of N-type 20. The drain extension region 23 is formed to surround a high concentration doped drain region 25 (see FIG. 2D) formed later, and serves to mitigate an electric field of the high concentration doped drain region 25. To this end, a concentration of the drain extension region 23 is designed to be lower than that of the drain region 25.

A dopant concentration of the N-type drain extension region 23 may be different from a dopant concentration of the first deep well of N-type 20. By way of example, a dopant concentration of the N-type drain extension region 23 may be higher than that of the first deep well of N-type 20. By making a dopant concentration of the N-type drain extension region 23 higher than that of the first deep well of N-type 20, a breakdown voltage of a semiconductor device can be increased.

As shown in FIG. 2B, similar to the example in FIG. 1B, a first buried layer of a P-type 51 is formed near the N-type drain extension region 23 or the drain region 25 in the first deep well of N-type 20. Also, a second buried layer of a P-type 52 is formed near a source region 45 (see FIG. 2D) to be formed later, although this is optional.

Figure 2C:
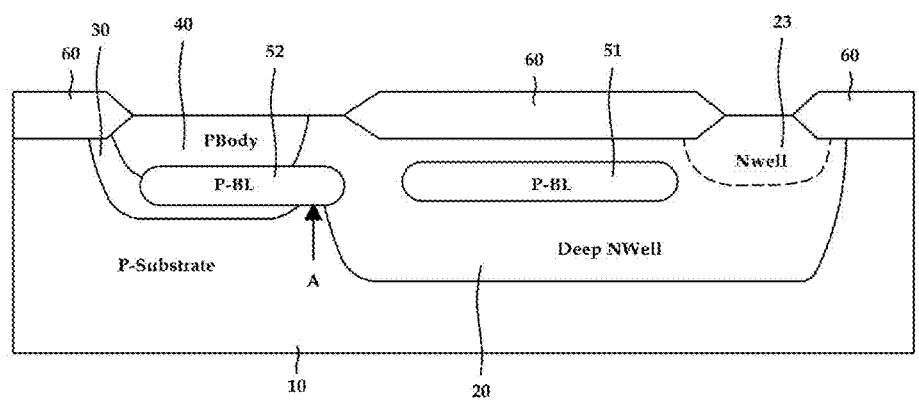

Subsequently, as shown in FIG. 2C, by using a body mask pattern 100-2 (see FIG. 10), a P-type body region 40 is formed. The P-type body region 40 is surrounded by the second deep well of N-type 30 already formed. A PN junction region is thus formed between the second deep well of N-type 30 and the P-type body region 40.

Figure 2D:
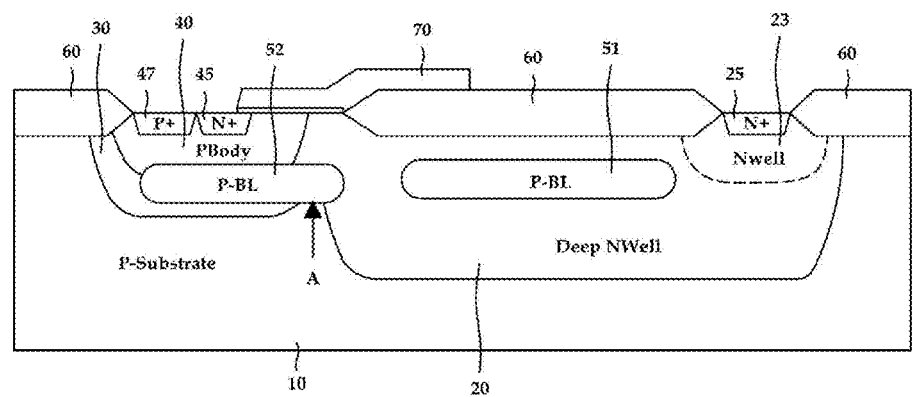

Subsequently, as shown in FIG. 2D, similar to the example in FIG. 1D, a high concentration N-type (N+) drain region 25 is formed inside the first deep well of N-type 20. A high concentration N-type (N+) source region 45 and a high concentration P-type (P+) body contact region 47 are formed inside the P-type body region 40. Further, a gate electrode 70 is formed as a gate oxide layer overlapping the P-type body region 40, the first deep well of N-type 20, and the second deep well of N-type 30. A portion of the gate electrode 70 is formed on a thick LOCOS oxide layer 60 or an STI oxide layer 60. A P-type body region that is overlapped by the gate electrode 70 forms a channel region, and the first deep well of N-type 20 and the second deep well of N-type 30 that are overlapped by the gate electrode 70 form an accumulation region.

An N-channel JFET structure is formed in a lower end region of the body region and the drain region (i.e., an accumulation region), enabling a maximum drain-source voltage (BVDSS) to be maintained high.

By forming a salicide region (not shown) on the gate electrode 70 and an exposed silicon substrate, the semiconductor device may be operated as an N-type LDMOS. One of ordinary skill in the art will appreciate that the necessary process and device structure for this can be realized in an altered formation without departing from the spirit or scope of the example in FIGS. 2A to 2D.

A semiconductor device according to the aforementioned fabricating process is designed so that a second deep well of an N-type 30 is formed between a P-type substrate 10 and a P-type body region 40, thus enabling an electric potential of the P-type body region 40 to be different from an electric potential of the P-type substrate 10. This makes it possible to maintain the N+ source region 45 and the P+ body contact region 47 at the same electric potential, and eliminate a body effect. That is, it is possible for an electric field of the P-type body region 40 to be higher than an electric field of the P-type substrate 10.

Figure 3A:
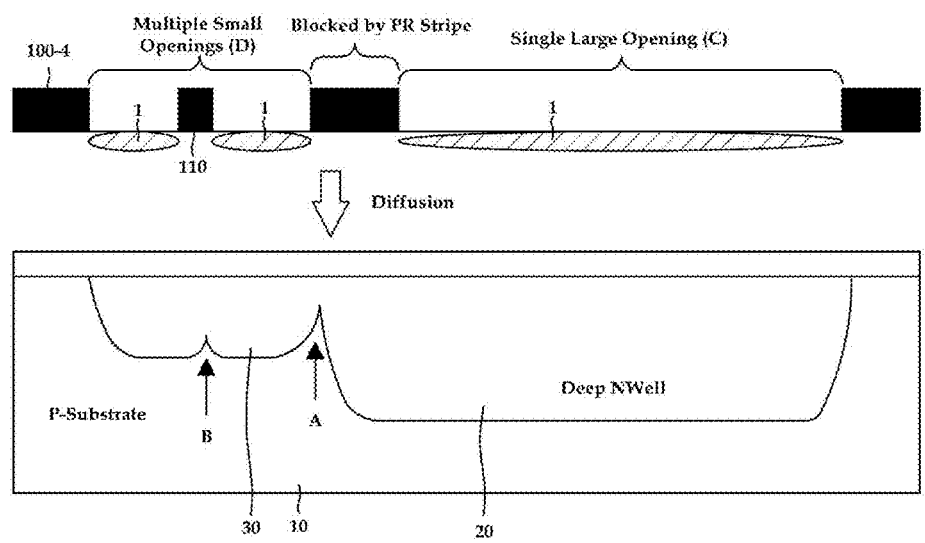
FIGS. 3A and 3B illustrate another example of a method of fabricating a semiconductor device.
Figure 3B:
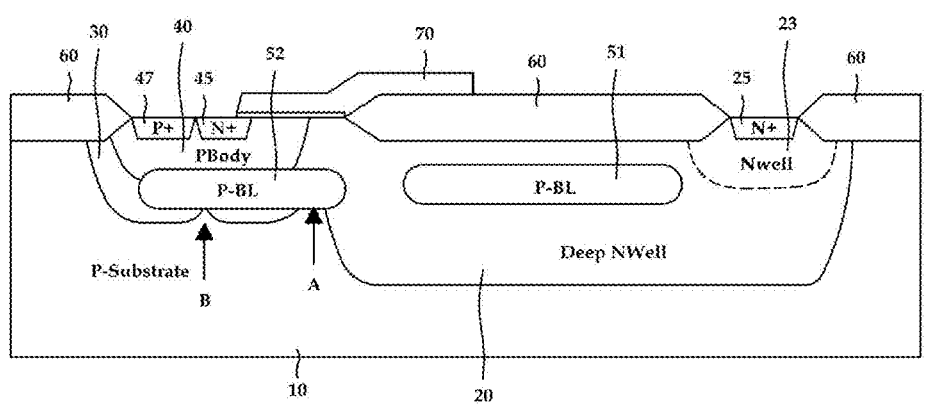

FIGS. 3A and 3B illustrate another example of a method of fabricating a semiconductor device. Although they are almost the same as the fabricating method shown in FIGS. 2A to 2B, the example of FIGS. 3A and 3B is characterized in that a method of fabricating a semiconductor device uses a mask pattern 100-4 in which one stripe 110 is formed in a space (D) for formation of a second deep well of an N-type 30 among the mask patterns used to form a first deep well of an N-type region 20 and a second deep well of an N-type 30. More specifically, unlike a D region of the mask pattern 100-3 that is applied in FIGS. 2A through 2D, a stripe 110 is formed in the D region of the mask pattern 100-4 to form two small openings in the D region. Each of the two small openings may be described as a slit, which is a long, narrow hole. By using the mask pattern 100-4 shaped as described above to simultaneously ion-implant an N-type dopant 1 such as phosphorus (P), arsenic (As), Antimony (Sb), or any other type of N-type dopant known to one of ordinary skill in the art, it is possible to simultaneously form the first deep well of N-type 20 and the second deep well of N-type 30 as shown in FIG. 3A. In other words, the second deep well of N-type 30 is formed of two wells disposed at a certain interval as shown in FIG. 3A, and thus has a W letter shape in which one groove (B) is formed in a bottom surface of the second deep well of N-type 30. Finally, a structure as shown in FIG. 3B is obtained. The configuration of the various layers in FIG. 3B except for the second deep well of N-type 30 is identical to the configuration of the various layers in FIGS. 2B to 2D, and thus a description thereof will be omitted. The effect of using the stripe 110 will be explained with respect to FIG. 5.

Figure 4A:
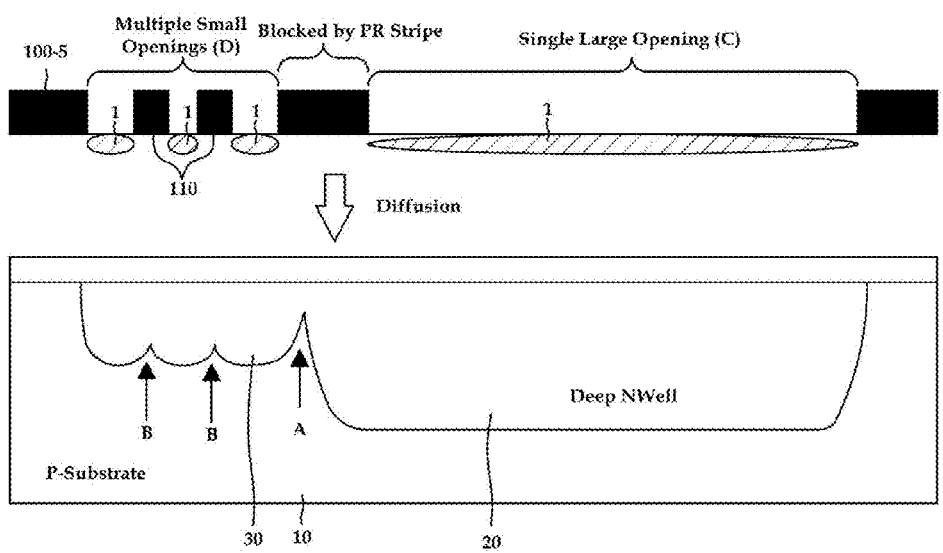
FIGS. 4A and 4B illustrate another example of a method of fabricating a semiconductor device.
Figure 4B:
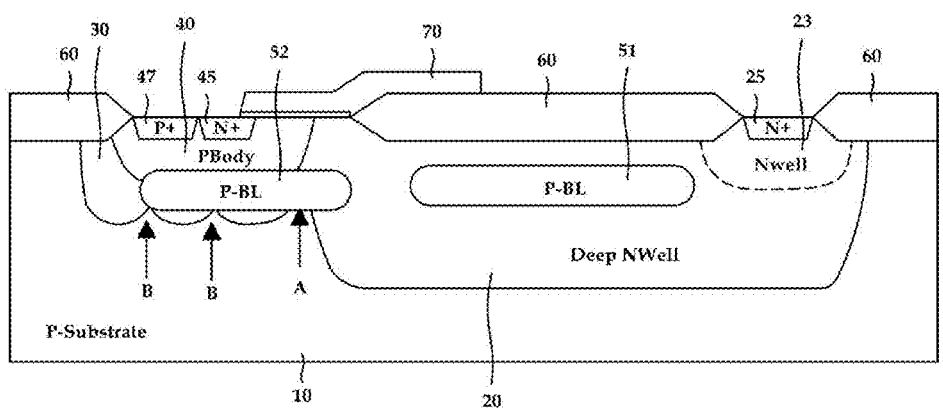

FIGS. 4A and 4B illustrate another example of a method of fabricating a semiconductor device. This example of a method of fabricating a semiconductor device is almost the same as the example of FIGS. 3A and 3B. The difference is that one stripe 110 is formed in the D region of the mask pattern 100-4 of FIG. 3A, while multiple stripes 110 are formed in the mask pattern 100-5 of FIG. 4A. Namely, two stripes 110 are formed in the mask pattern 100-5 of FIG. 4A. As shown in FIG. 4A, by using the mask pattern 100-5 to simultaneously ion-implant an N-type dopant 1 such as phosphorus (P), arsenic (As), Antimony (Sb), or any other type of N-dopant known to one of ordinary skill in the art, it is possible to simultaneously form the first deep well of N-type 20 and the second deep well of N-type 30 as shown in FIG. 4A. Namely, the second deep well of N-type 30 is formed of three wells disposed at a certain interval as shown in FIG. 4A, and thus has a wave pattern shape in which two grooves (B) are formed in a bottom surface of the second deep well of N-type 30. This increases a breakdown voltage under a reverse-biased condition between an N-type drain region 25 and a source region 45. That is, due to the grooves, a distance between the P-type body region 40 and the P-type substrate 10 is less at the grooves of the second deep well of N-type 30 than at other positions in the second deep well of N-type 30, thus allowing a depletion region to be easily obtained. Finally, a structure as shown FIG. 4B is obtained. The configuration of the various layers in FIG. 4B except for the second deep well of N-type 30 is identical to the configuration of the various layers in FIGS. 2B to 2D, and thus a description thereof will be omitted. The effect of using the stripes 110 will be explained with respect to FIG. 5.

Figure 5:
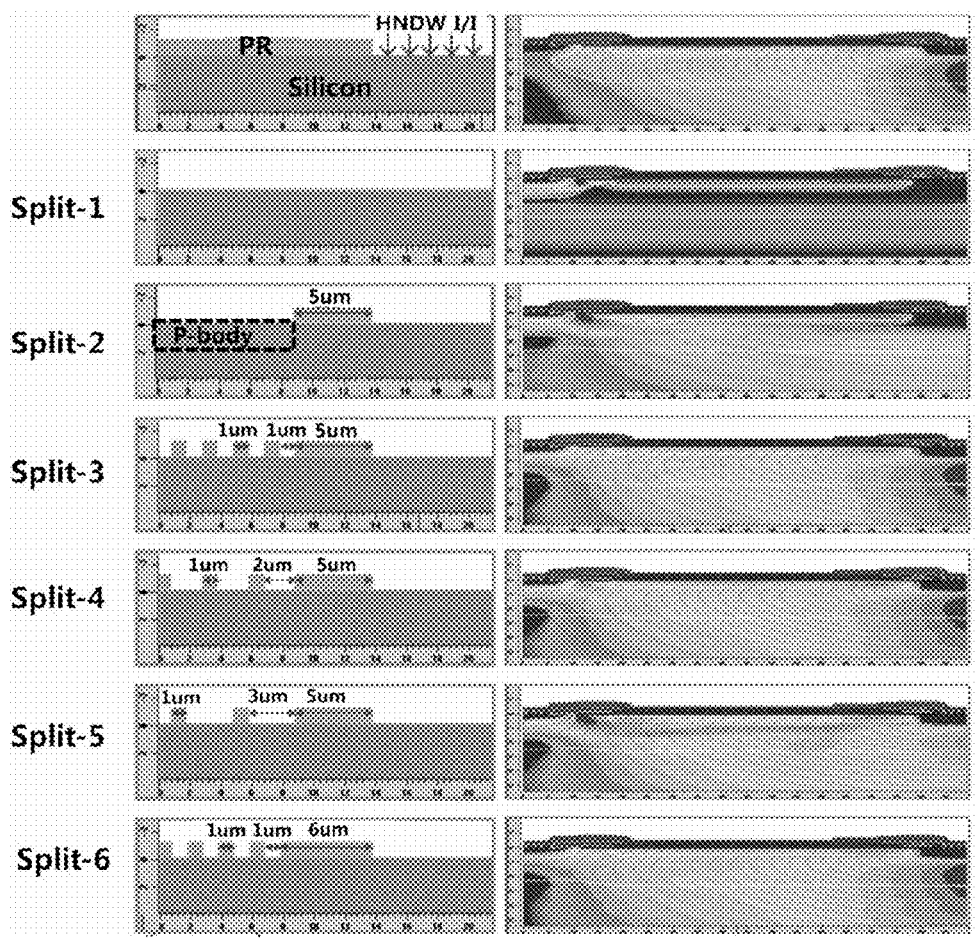
FIG. 5 illustrates examples of 2D (two-dimensional) simulation results of a semiconductor device formed by various fabricating methods described in this application compared to the related art.
Figure 6:
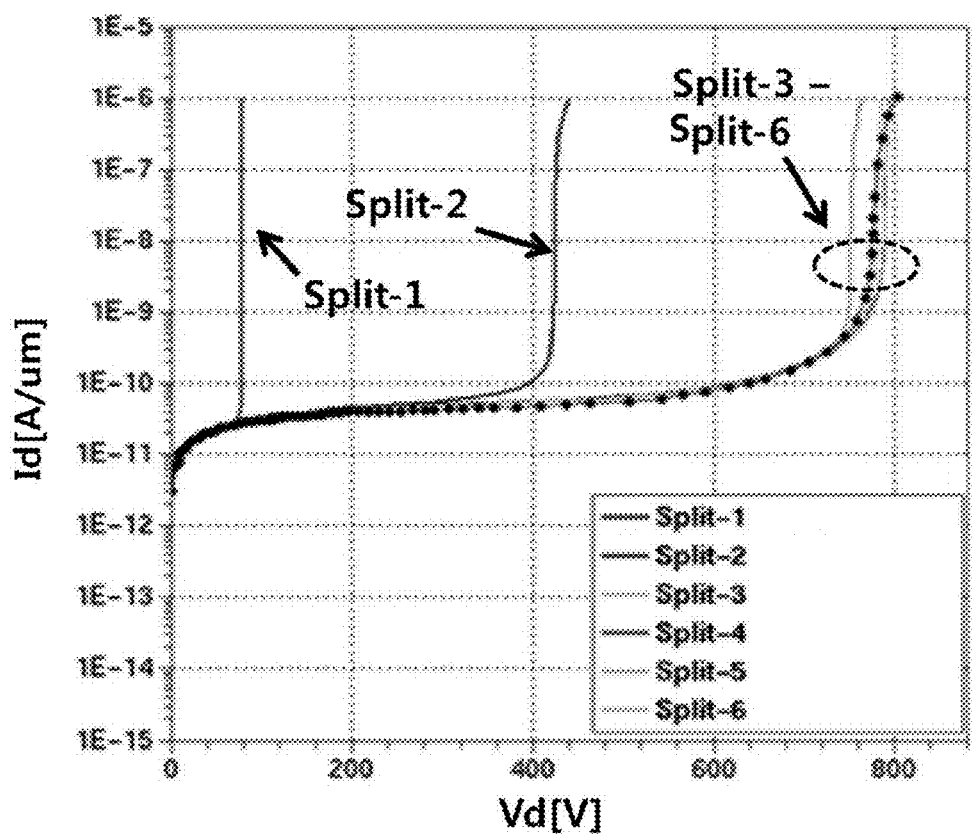
FIG. 6 illustrates an example of a Vd-Id graph for various fabricating methods in FIG. 5.

FIG. 5 illustrates examples of 2D (two-dimensional) simulation results of a semiconductor device formed by the various fabricating methods described above compared to the related art. A drawing in the left column illustrates a fabricating method of each of 6 split conditions, and a drawing in the right column illustrates a device simulation result showing an electric field for each of the 6 split conditions. FIG. 6 illustrates an example of a Vd-Id graph for various fabricating methods in FIG. 5.

Split-1 is a result regarding the related art; it shows a case in which depths of a first deep well of an N-type 20 and a second deep well of an N-type 30 are the same. Namely, it is a case in which a bottom surface of the first deep well of N-type 20 and a bottom surface of the second deep well of N-type 30 are coplanar. Referring to the simulation result showing an electric field, Split-1 shows a very high impact ionization rate not only under a LOCOS layer but also under a P-type body region under a gate electrode. The darker the shade in the simulation result showing an electric field, the higher the impact ionization rate. As shown in the Vd-Id graph of FIG. 6, Split 2 Split-1 has a breakdown voltage of 79 V, which is a very low voltage.

Split-2 is a case in which depths of a first deep well of an N-type 20 and a second deep well of an N-type 30 are different, and is similar to FIGS. 1D and 2D. Referring to the simulation result of Split-2, an electric field under the LOCOS layer becomes uniform with a certain level compared to Split-1; still it can be seen that an impact ionization rate value near the P-type body region 40 has a very high value compared to the other regions as indicated by the dark area in this region. As shown in the Vd-Id graph of FIG. 6, Split-2 has a breakdown voltage of 439 V, which is a lower voltage than a target voltage of 700 V or more.

Split-3 to Split-6 are cases of using a mask pattern in which one or more stripes are formed in a region of a mask pattern used to form a second deep well of an N-type 30. They are similar to FIGS. 3A and 3B and 4A and 4B. The second deep well of N-type 30 is a case in which multiple wells are disposed at a certain interval in a W letter shape in which one groove (B) is formed in the bottom surface or a wave pattern shape in which multiple grooves (B) are formed in the bottom surface. Split-3 is a case in which four stripes having a stripe interval of 1 μm are formed in the mask pattern. In Split-3, a breakdown voltage (BVDSS) is greatly increased compared to Split-1 and Split-2. As shown in the Vd-Id graph of FIG. 6, the breakdown voltage is 795 V, and it follows that the device structure can withstand a voltage of 700 V or more. This is because, by forming the stripes, an electric field becomes very uniform as shown in the simulation result of Split-3. Referring to the simulation result of Split-3, it can be seen that a portion near the P-type body region 40 where an electric field value is very high compared to the other regions in the simulation result of Split-2 has disappeared in the simulation result of Split-3.

Split-4 and Split-5 are cases in which the number of stripes is reduced by two compared to Split-3, and the stripe interval is adjusted. That is, in Split-4 and Split-5, two stripes are formed in the mask pattern, while in Split-3, four stripes are formed in the mask pattern. The stripe interval in Split-3 is 1 μm; the stripe interval in Split-4 is 2 μm; and the stripe interval in Split-5 is 3 μm. Referring to Split-4, even though the number of stripes is reduced by two and the stripe interval is increased to 2 μm, there is no difference from Split-3 in that the BVDSS value is 795 V. When the stripe interval is increased to 3 μm as in Split-5, the BVDSS value falls slightly falls to 764 V, but still a target BVDSS value of 700 V or more is achieved. Hence, it may be understood that if the stripe interval is 3 μm or less, a target BVDSS value of 700 V or more will be achieved. More appropriately, it may be understood that a stripe interval of 0.5-3 μm is appropriate.

Split-6 is a case in which a length of a mask pattern at a boundary surface is changed 6 μm compared to 5 μm in Split-3. The BVDSS value of Split-6 is 787 V, which is still a target BVDSS value of 700 V or more. Therefore, it may be understood that if a length of a mask pattern at a boundary surface is 5-6 μm, a target BVDSS of 700 V or more may be achieved.

FIG. 7 illustrates an example of a table of maximum drain-source breakdown voltages (BVDSS) for various fabricating methods in FIG. 5. As can be seen from the table, in all of Split-3 to Split-6, a drain-source breakdown voltage (BVDSS) is increased to within a range of 760 V to 800 V compared to Split-1 and Split-2. This is a result of an electric field value distribution inside a semiconductor device being uniform in Split-3 to Split-6. Also, when one or more stripes are formed in a region of a mask pattern used to form a second deep well of an N-type 30, the second deep well of an N-type 30 is configured so that a depth at a groove or grooves in the bottom surface is less than in a case of not using a stripe. Also, when many stripes are used, a space for an ion implantation becomes small, so that a dopant concentration of a second deep well of an N-type 30 is lower than in a case of not using a stripe at all. As the depth and the concentration decrease, a depletion region is easily secured from a P-type body region 40 to a direction of the N-type second deep well of N-type 30, thereby increasing a BVDSS value.

In a method of fabricating a semiconductor device according to the examples described above, a second deep well of the same conductivity type as a first deep well of a second conductivity type that includes a drain region is formed in a substrate of a first conductivity type, but has a depth that is smaller than a depth of the first deep well, and a body region of the first conductivity type that includes a source region is formed so that is surrounded by the second deep well, thereby allowing a breakdown voltage to be increased without additionally forming a thick epitaxial layer or buried layer.

Further, by forming the second deep well, not only is a breakdown voltage between the drain region and the source region increased, but also the source region and the body region can be isolated from the substrate. This makes it possible to apply a potential or voltage higher than a potential or voltage applied to the substrate to the source region or the body region.

Further, by forming the second deep well to have the depth less than the depth of the first deep well, the second deep well provides an impedance path that is higher than if the depth of the second deep well were the same as the depth of the first deep well.

Further, through the technical configuration as set forth above, a maximum drain-source voltage (BVDSS) is not affected and a body potential can be higher than a substrate potential.

Further, by forming the second body deep well, a higher potential may be applied to the body region than to the substrate, a source region and a body contact region may be maintained at the same potential, and a body effect can be eliminated.

The second deep well and the body region may be formed by one mask process, thereby enabling a unit price of the fabricating process to be lowered.

The first deep well and the second deep well may be formed by one mask process, thereby enabling a unit price of the fabricating process to be lowered.

While this disclosure includes specific examples, it will be apparent to one of ordinary skill in the art that various changes in form and details may be made in these examples without departing from the spirit and scope of the claims and their equivalents. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure. In the claims, means-plus-function clauses are intended to cover the structures described herein as performing the recited function, and not only structural equivalents but also equivalent structures.

What is claimed is:

1. A method of fabricating a semiconductor device, the method comprising:
    forming a first deep well and a second deep well in a substrate,
        wherein a depth of the first deep well is less than a depth of the second deep well,
        wherein the first deep well is in direct contact with the substrate, and
        wherein a boundary groove separates the first deep well from the second deep well;
    forming a body region inside the first deep well, wherein a conductivity type of the body region is different from a conductivity type of the first deep well;
    forming a drain region inside the second deep well; and
    forming a source region inside the body region.

2. The method of fabricating a semiconductor device of claim 1,
    wherein a bottom surface of the first deep well includes a non-boundary groove, and
    wherein a depth from a peak of the boundary groove to a top surface of the first deep well is less than a depth from a peak of the non-boundary groove to the top surface of the first deep well.

3. The method of fabricating a semiconductor device of claim 1, further comprising forming a drain extension region inside the second deep well;
    wherein the forming of the drain region inside the second deep well comprises forming the drain region inside the drain extension region.

4. The method of fabricating a semiconductor device of claim 1, wherein a dopant concentration of the first deep well under the body region is smaller than a dopant concentration of the second deep well under the drain region.

5. The method of fabricating a semiconductor device of claim 1, wherein the forming of the first deep well and the second deep well comprises:
    using a deep well mask pattern formed on the substrate, the deep well pattern comprising a stripe.

6. The method of fabricating a semiconductor device of claim 5, wherein the forming of the first deep well and the second deep well comprises:
    forming the deep well mask pattern comprising the stripe on the substrate; and
    implanting ions into the substrate through the deep well mask pattern to form the first deep well and the second deep well.

7. The method of fabricating a semiconductor device of claim 5, wherein the mask pattern comprises a plurality of stripes.

8. The method of fabricating a semiconductor device of claim 7, wherein a stripe interval between stripes is greater than 0 μm and less than or equal to 3 μm.

9. The method of fabricating a semiconductor device of claim 1, wherein either or both of: a bottom surface of the first deep well under the body region comprises a plurality of non-boundary grooves, and the bottom surface of the first deep well under the body region has a shape of a wave pattern.

10. The method of fabricating a semiconductor device of claim 1, wherein a breakdown voltage between the drain region and the source region (BVDSS) is at least 700 V.

11. The method of fabricating a semiconductor device of claim 1, further comprising:
    forming a buried layer in contact with the first deep well, with the body region, and with the substrate, wherein the buried layer has a same conductivity type as the body region.

12. The method of fabricating a semiconductor device of claim 11, further comprising:
    forming an additional buried layer in the second deep well.

13. The method of fabricating a semiconductor device of claim 11, wherein the buried layer is in contact with the second deep well.

14. The method of fabricating a semiconductor device of claim 1,
    wherein the boundary groove that separates the first deep well from the second deep well is disposed below a gate oxide layer and not below a local oxidation of silicon (LOCOS) layer.

15. The method of fabricating a semiconductor device of claim 1,
    wherein a region proximate to the boundary groove has a lower dopant concentration than other regions of the first deep well and the second deep well.

16. A method of fabricating a semiconductor device, the method comprising:
    forming a first deep well, a second deep well, and a boundary groove configured to partially separate the first deep well from the second deep well, all in a substrate,
        wherein a depth of the first deep well is less than a depth of the second deep well,
        wherein the first deep well is in direct contact with the substrate,
        wherein a bottom surface of the first deep well includes a non-boundary groove,
        wherein a bottom surface of the second deep well is substantially planar, and
        wherein a first depth from a peak of the boundary groove to a top surface of the first deep well is less than a second depth from a peak of the non-boundary groove to the top surface of the first deep well, and both the first and second depths are less than a depth from a bottom surface of the first deep well to the top surface of the first deep well;
    forming a body region inside the first deep well, wherein a conductivity type of the body region is different from a conductivity type of the first deep well;
    forming a drain region inside the second deep well; and
    forming a source region inside the body region;
    wherein a region proximate to the boundary groove has a lower dopant concentration than other regions of the first deep well and the second deep well.

* * * * *